US009786577B2

(12) United States Patent
Terasaki et al.

(10) Patent No.: US 9,786,577 B2
(45) Date of Patent: Oct. 10, 2017

(54) POWER MODULE SUBSTRATE, HEAT-SINK-ATTACHED POWER-MODULE SUBSTRATE, AND HEAT-SINK-ATTACHED POWER MODULE

(71) Applicant: MITSUBISHI MATERIALS CORPORATION, Tokyo (JP)

(72) Inventors: Nobuyuki Terasaki, Kitamoto (JP); Yoshiyuki Nagatomo, Kitamoto (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/305,689

(22) PCT Filed: Apr. 24, 2015

(86) PCT No.: PCT/JP2015/062544
§ 371 (c)(1),
(2) Date: Oct. 21, 2016

(87) PCT Pub. No.: WO2015/163452
PCT Pub. Date: Oct. 29, 2015

(65) Prior Publication Data
US 2017/0047268 A1  Feb. 16, 2017

(30) Foreign Application Priority Data

Apr. 25, 2014  (JP) .................................. 2014-091814

(51) Int. Cl.
*H01L 23/52*  (2006.01)
*H01L 21/44*  (2006.01)
(Continued)

(52) U.S. Cl.
CPC .......... *H01L 23/3735* (2013.01); *H01L 23/12* (2013.01); *H01L 23/13* (2013.01);
(Continued)

(58) Field of Classification Search
CPC ................................................... H01L 23/3735
(Continued)

(56) References Cited

U.S. PATENT DOCUMENTS

| 6,197,435 B1 | 3/2001 | Tsujimura et al. |
| 2006/0157862 A1 | 7/2006 | Nishimura et al. |

(Continued)

FOREIGN PATENT DOCUMENTS

| JP | 11-195854 A | 7/1999 |
| JP | 2003-078086 A | 3/2003 |

(Continued)

OTHER PUBLICATIONS

International Search Report mailed Jul. 7, 2015, issued for PCT/JP2015/062544.

*Primary Examiner* — Calvin Lee
(74) *Attorney, Agent, or Firm* — Locke Lord LLP

(57) ABSTRACT

A power-module substrate including a circuit layer having a first aluminum layer bonded on one surface of a ceramic substrate and a first copper layer bonded on the first aluminum layer by solid-phase-diffusion bonding, and a metal layer having a second aluminum layer made from a same material as the first aluminum layer and bonded on the other surface of the ceramic substrate and a second copper layer made from a same material as the first copper layer and bonded on the second aluminum layer by solid-phase-diffusion bonding, in which a thickness t1 of the first copper layer is 1.7 mm to 5 mm, a sum of the thickness t1 of the first copper layer and a thickness t2 of the second copper layer is 7 mm or smaller, and a ratio t2/t1 is larger than 0 and 1.2 or smaller except for a range of 0.6 to 0.8.

3 Claims, 7 Drawing Sheets

(51) Int. Cl.

| | |
|---|---|
| *H01L 23/373* | (2006.01) |
| *H01L 31/04* | (2014.01) |
| *H01L 23/12* | (2006.01) |
| *H01L 23/13* | (2006.01) |
| *H01L 23/36* | (2006.01) |
| *H01L 25/07* | (2006.01) |
| *H01L 25/18* | (2006.01) |
| *H01L 23/367* | (2006.01) |

(52) U.S. Cl.
CPC ............ *H01L 23/36* (2013.01); *H01L 23/367* (2013.01); *H01L 25/07* (2013.01); *H01L 25/18* (2013.01); *H01L 31/04* (2013.01); *H01L 2224/32225* (2013.01)

(58) Field of Classification Search
USPC .......... 257/675, 706, 750; 438/119–122, 652
See application file for complete search history.

(56) References Cited

U.S. PATENT DOCUMENTS

| | | |
|---|---|---|
| 2015/0034367 A1 | 2/2015 | Nagatomo et al. |
| 2015/0041188 A1 | 2/2015 | Terasaki et al. |
| 2016/0021729 A1* | 1/2016 | Nagatomo .............. H01L 25/07 361/748 |

FOREIGN PATENT DOCUMENTS

| | | |
|---|---|---|
| JP | 2006-202884 A | 8/2006 |
| JP | 2013-229579 A | 11/2013 |
| JP | 2014-039062 A | 2/2014 |

\* cited by examiner

POWER MODULE SUBSTRATE, HEAT-SINK-ATTACHED POWER-MODULE SUBSTRATE, AND HEAT-SINK-ATTACHED POWER MODULE

BACKGROUND OF THE INVENTION

Technical Field

The present invention relates to a power-module substrate, a heat-sink-attached power-module substrate, and a heat-sink-attached power module used for a semiconductor device controlling large current and high voltage.

Priority is claimed on Japanese Patent Application No. 2014-91814, filed Apr. 25, 2014, the content of which is incorporated herein by reference.

Background Art

A structure conventionally known as a power-module substrate is the following: a metal plate to be a circuit layer is bonded on one side of surfaces of a ceramic substrate to be an insulating layer; and a metal plate to be a metal layer is bonded on the other side of the surfaces of the ceramic substrate. A heat-sink-attached power-module substrate is made by bonding a heat sink having an excellent thermal conductivity on the metal layer provided on one surface of the power-module substrate. A heat-sink-attached power module is made by mounting a semiconductor element such as a power device or the like on the circuit layer, with soldering material therebetween.

In the heat-sink-attached power-module substrate of this kind, as described in Patent Document 1, there is a case in which copper having an excellent electrical characteristics is used for the metal plate to be the circuit layer and aluminum is used for the metal plate to be the metal layer for a purpose of decreasing thermal stress between the ceramic substrate and the heat sink.

CITATION LIST

Patent Literature

Patent Document 1: Japanese Unexamined Patent Application, First Publication No. 2013-229579

SUMMARY OF INVENTION

Technical Problem

By forming the circuit layer from copper as above, it is possible to radiate heat of the semiconductor element more rapidly than in a case in which aluminum is used. In order to radiate the heat of the semiconductor element more rapidly, it is effective to increase a thickness of the circuit layer. However, if the circuit layer is too thick, the circuit layer may bend largely by thermal expansion owing to difference in the thermal expansion from the ceramic substrate, so that there may be a problem of mounting by obstruction of bonding the semiconductor element or generation of a breakage of the ceramic substrate.

Meanwhile, since aluminum having inferior solderability is used as the metal layer, the surface thereof should be plated with Ni when bonding the metal layer made of aluminum and the heat sink by solder, accordingly there is a problem of deterioration of productivity. Moreover, since aluminum has relatively low deformation resistance, the metal layer may be deformed when a thermal cycling is applied on the power module, as a result, the solder cracks, so that there are problems of deterioration of bonding reliability or a rise of thermal resistance.

The present invention is achieved in consideration of the above circumstances, and has an object to provide a power-module substrate, a heat-sink-attached power-module substrate, and a heat-sink-attached power module in which the deterioration of the bonding reliability and the rise of the thermal resistance can be prevented while the thermal cycling is applied, and furthermore the breakage of the ceramic substrate can be prevented.

Solution to Problem

In order to reduce the bend deformation owing to the thermal cycling, the circuit layer and the metal layer may be made up to be symmetry by forming them from the same material having the same thicknesses and the like and by bonding them on both the surfaces of the ceramic substrate. However, recently, it is required for the power module to be small and thin, and furthermore, usage environment is hard and quantity of heat of the semiconductor element is large, so that conditions of both thermal cycling and power cycling are hard or tight. It is effective that the circuit layer is thick in order to radiate the heat of the semiconductor element. Meanwhile, it is desirable that the metal layer is thin for the whole power module to be small. Accordingly, the power-module substrate of the present invention solves this problem as the following.

The present invention is a power-module substrate including a circuit layer which is stacked on one surface of a ceramic substrate and a metal layer which is stacked on the other surface of the ceramic substrate, in which the circuit layer has a first aluminum layer which is bonded on the one surface of the ceramic substrate and a first copper layer which is bonded on the first aluminum layer by solid-phase-diffusion bonding, the metal layer has a second aluminum layer which is made from a same material as that of the first aluminum layer and bonded on the other surface of the ceramic substrate, and a second copper layer which is made from a same material as that of the first copper layer and bonded on the second aluminum layer by solid-phase-diffusion bonding, a thickness t1 of the first copper layer is 1.7 mm or larger and 5 mm or smaller, a sum of the thickness t1 of the first copper layer and a thickness t2 of the second copper layer is 7 mm or smaller, a ratio t2/t1 between the thickness t1 of the first copper layer and the thickness t2 of the second copper layer is larger than 0 and 1.2 or smaller except for a range of 0.6 or larger and 0.8 or smaller.

In the power-module substrate which is structured as above, it is possible to diffuse heat of the semiconductor element effectively at the first copper layer along a surface direction since the circuit layer is formed from the first aluminum layer bonded on the one surface of the ceramic substrate and the first copper layer bonded on the first aluminum layer and the semiconductor element is mounted on the first copper layer. The first aluminum layer having relatively small deformation resistance is bonded to the ceramic substrate, so that it is possible for the first aluminum layer to absorb thermal stress owing to a difference of thermal-expansion coefficients between the ceramic substrate and the circuit layer when a thermal cycling is applied. Accordingly, it is possible to prevent a breakage of the ceramic substrate. Furthermore, because the first copper layer with relatively large deformation resistance is bonded on the first aluminum layer, it is possible to reduce deformation of the circuit layer when a power cycle is applied, so that it is possible to prevent solder bonding the circuit layer and the semiconductor element from cracking.

Since the first aluminum layer and the first copper layer are bonded to each other by solid-phase-diffusion bonding, it is possible to prevent the first aluminum layer and the first copper layer from separation when the thermal cycling is applied, so that thermal conductivity and electric conductivity of the circuit layer can be well maintained.

In this case, the thickness t1 of the first copper layer is 1.7 mm or larger and 5 mm or smaller. If the thickness t1 is smaller than 1.7 mm, the heat of the semiconductor element is difficult to be diffused along the surface direction. Accordingly, the heat resistance by the power cycle cannot be sufficiently reduced, so that it is difficult to maintain reliability against the power cycle. Moreover, if a range of the thickness t1 is larger than 5 mm, there is no difference in heat radiation performance. Therefore, the thickness t1 is 5 mm or smaller in order to reduce size of the whole power module.

The sum of the thickness t1 of the first copper layer and the thickness t2 of the second copper layer is 7 mm or smaller. If the sum of them is larger than 7 mm, thermal stress is generated in the ceramic substrate excessively by the thermal cycling, the ceramic substrate may crack.

Since the metal layer is formed from the second aluminum layer which is bonded on the other surface of the ceramic substrate and the second copper layer which is bonded on the second aluminum layer, it is possible to bond the metal layer and the heat sink favorably without nickel plating. In a case in which the power-module substrate and the heat sink are bonded by soldering, since the heat sink and the second copper layer having relatively high deformation resistance are bonded, it is possible to prevent the solder from cracking owing to the deformation of the metal layer, prevent the bonding reliability from deteriorating, and reduce a rise of the heat resistance when the thermal cycling is applied. Furthermore, since the second aluminum layer which is bonded on the second copper layer has the relatively small deformation resistance, even if the thermal cycling is applied, the thermal stress can be absorbed by the second aluminum layer between the ceramic substrate and the second copper layer, and it is possible to prevent the ceramic substrate from cracking.

Since the second aluminum layer and the second copper layer are bonded to each other by solid-phase-diffusion bonding, it is possible to prevent the second aluminum layer and the second copper layer from separation when the thermal cycling is applied, so that the thermal conductivity of the metal layer can be well maintained.

The ratio t2/t1 between the thickness t1 of the first copper layer and the thickness t2 of the second copper layer is larger than 0 and 1.2 or smaller except for the range of 0.6 or larger and 0.8 or smaller. If the ratio t2/t1 is in the range of 0.6 or larger and 0.8 or smaller, the bend deformation of the whole power-module substrate is small, since the thickness t1 of the first copper layer and the thickness t2 of the second copper layer are relatively near. However, the ceramic substrate may crack although an amount of the bend deformation of the whole power-module substrate is small. It is because rigidity of the second copper layer is high since the thickness t2 of the second copper layer is thick to be near to the thickness of the first copper layer, so that force applied on the ceramic substrate is large by the bend deformations in opposite directions at the first copper layer and the second copper layer when the thermal cycling is applied.

If the ratio t2/t1 is smaller than 0.6, the second copper layer can be deformed along with the first copper layer since the rigidity of the second copper layer is low, so that it is possible to prevent the ceramic substrate from cracking, although the bend deformation of the power-module substrate by the thermal cycling is large owing to the difference of the thermal expansion between the first copper layer and the second layer since the thickness t2 of the second copper layer is smaller than the thickness t1 of the first copper layer.

In the range in which the ratio t2/t1 is larger than 0.8, since the thickness t1 of the first copper layer and the thickness t2 of the second copper layer are almost the same, the bend deformation of the first copper layer and the bend deformation of the second copper layer are balanced when the thermal cycling is applied, it is possible to reduce the bend deformation of the power-module substrate so that the ceramic substrate can be prevented from cracking.

A heat-sink-attached power-module substrate according to the present invention includes the above-mentioned power-module substrate and a heat sink which is bonded on the second copper layer.

Since the second copper layer of the power-module substrate is bonded to the heat sink, the metal layer and the heat sink can be bonded by soldering without Ni plating on the metal layer. Since the second copper layer having relatively high deformation resistance is bonded to the heat sink, it is possible to prevent deterioration of the bonding reliability and rise of the heat resistance by reducing the crack of solder when the thermal cycling is applied.

A heat-sink-attached power module according to the present invention includes the above-mentioned heat-sink-attached power-module substrate and a semiconductor element which is bonded on the circuit layer.

In this heat-sink-attached power module, even when the thermal cycling is applied, it is possible to prevent the deterioration of the bonding reliability and the rise of the heat resistance by preventing the crack of solder which bonds the metal layer and the heat sink.

Advantageous Effects of Invention

According to the present invention, when the thermal cycling is applied, it is possible to prevent the deterioration of the bonding reliability, the rise of the thermal resistance, and the breakage of the ceramic substrate.

DESCRIPTION OF EMBODIMENTS

Figure 1:
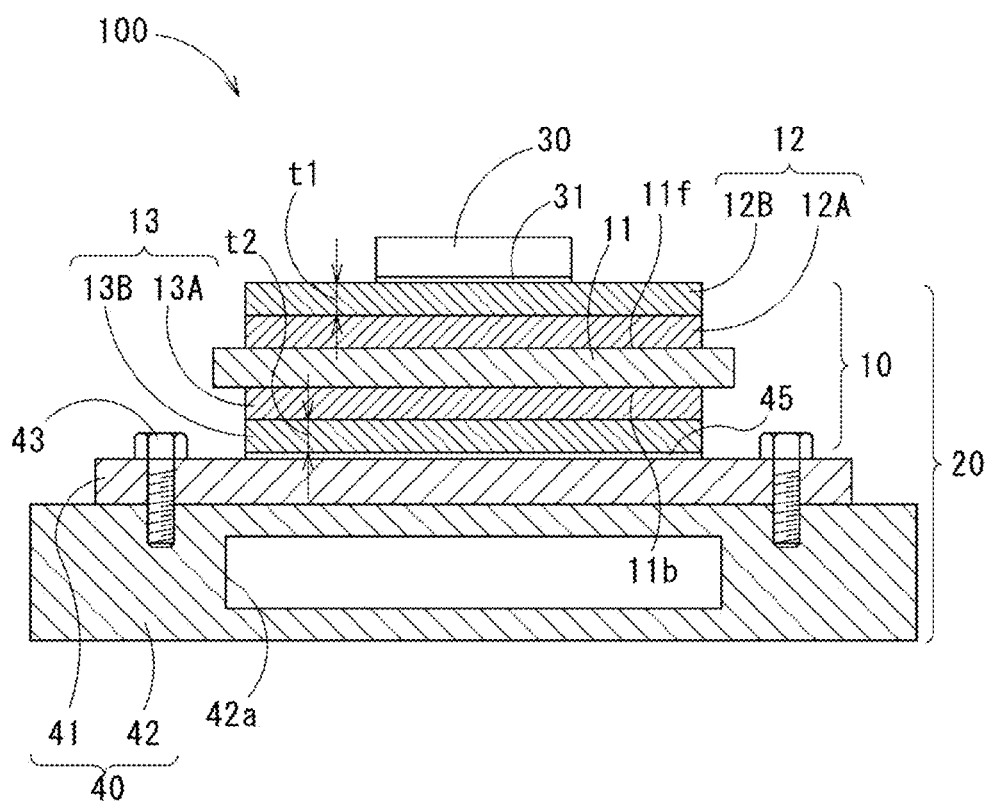
FIG. 1 is a sectional view explaining an outline of a heat-sink-attached power module including a power-module substrate of an embodiment according to the present invention.

Hereinafter, an embodiment of the present invention will be described referring drawings. A heat-sink-attached power module 100 is provided with a heat-sink-attached power-module substrate 20, and a semiconductor element 30 which is bonded to the heat-sink-attached power-module substrate 20. The heat-sink-attached power-module substrate 20 is provided with a power-module substrate 10, and a heat sink 40 which is bonded to the power-module substrate 10.

The power-module substrate 10 has a ceramic substrate 11, a circuit layer 12 which is stacked on one surface 11f of the ceramic substrate 11 and a metal layer 13 which is stacked on another surface 11b of the ceramic substrate 11.

The ceramic substrate 11 prevents electric connection between the circuit layer 12 and the metal layer 13, and formed of AlN, $Si_3N_4$, Al2O3 or the like. A thickness of the ceramic substrate 11 is in a range of 0.2 mm to 1.5 mm; in this embodiment, 0.635 mm.

The circuit layer 12 has a first aluminum layer 12A which is bonded on the one surface 11f of the ceramic substrate 11 and a first copper layer 12B which is stacked on one side (i.e., an upper side in FIG. 1) of the first aluminum layer 12A.

A first aluminum layer 12A is formed by bonding a plate made of pure aluminum or aluminum alloy on the one surface 11f of the ceramic substrate 11. In the present embodiment, the first aluminum layer 12A is made from a rolled sheet of aluminum having purity of 99.99% or higher (so-called 4N aluminum).

The first copper layer 12B is formed by bonding a plate made of pure copper or copper alloy on the one side (i.e., an upper side in FIG. 1) of the first aluminum layer 12A. In the present embodiment, the first copper layer 12B is formed by bonding a copper plate made of a rolled sheet of oxygen-free copper on the first aluminum layer 12A by solid-phase-diffusion bonding.

The metal layer 13 has a second aluminum layer 13A which is bonded on the other surface 11b of the ceramic substrate 11, and a second copper layer 13B which is stacked on another side (i.e., a lower side in FIG. 1) of the second aluminum layer 13A.

The second aluminum layer 13A is formed by bonding an aluminum plate made of the same material as that of the first aluminum layer 12A in the circuit layer 12 on the other surface 11b of the ceramic substrate 11. In the present embodiment, the second aluminum layer 13A is also formed by bonding the ceramic substrate 11 and an aluminum plate made of a rolled sheet of aluminum having purity of 99.99% or higher (so-called 4N aluminum) that is the same as the first aluminum layer 12A.

The second copper layer 13B is formed by bonding the same material as that of the first copper layer 12B in the circuit layer 12 on another side (i.e., a lower side in FIG. 1) of the second aluminum layer 13A. Accordingly, in the present embodiment, the second copper layer 13B is formed by bonding a copper plate made of a rolled sheet of oxygen-free copper that is the same as the first copper layer 12B on the second aluminum layer 13A by solid-phase-diffusion bonding.

In the power-module substrate 10 structured as above, a thickness t1 of the first copper layer 12B in the circuit layer 12 is 1.7 mm or larger and 5 mm or smaller. A sum of the thickness t1 of the first copper layer 12B and a thickness t2 of the second copper layer 13B is 7 mm or smaller. A ratio t2/t1 between the thickness t1 of the first copper layer 12B and the thickness t2 of the second copper layer 13B is in a range larger than 0 and 1.2 or smaller except for a range of 0.6 or larger and 0.8 or smaller.

In the present embodiment, surface sizes of the circuit layer 12 and the metal layer 13 are smaller than that of the ceramic substrate 11 having a square shape with side length of 30 mm or larger and 50 mm or smaller.

Figure 2:
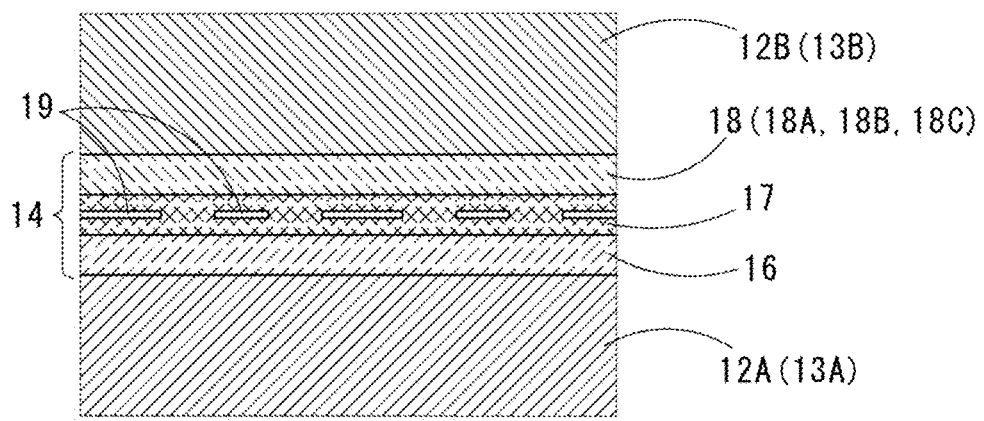
FIG. 2 is a sectional view explaining an essential part of a bonding interface between a first aluminum layer and a first copper layer in a circuit layer.

The first aluminum layer 12A and the first copper layer 12B structuring the circuit layer 12 are bonded to each other by solid-phase-diffusion bonding as described above; and at a boundary surface between them, an intermetallic compound layer 14 is formed as shown in FIG. 2. The intermetallic compound layer 14 is formed by mutually diffusing Al atoms of the first aluminum layer 12A and Cu atoms of the first copper layer 12B. The intermetallic compound layer 14 at the boundary surface formed between the first aluminum layer 12A and the first copper layer 12B has a concentration gradient in which concentration of Al atoms is decreased and concentration of Cu atoms is increased from the first aluminum layer 12A toward the first copper layer 12B.

Similarly, the second aluminum layer 13A and the second copper layer 13B structuring the metal layer 13 are bonded by solid-phase-diffusion bonding as described above; and at a boundary surface between them, an intermetallic compound layer 14 is formed as shown in FIG. 2. The intermetallic compound layer 14 is formed by mutually diffusing Al atoms of the second aluminum layer 13A and Cu atoms of the second copper layer 13B. The intermetallic compound layer 14 formed at the boundary surface between the second aluminum layer 13A and the second copper layer 13B has a concentration gradient in which concentration of Al atoms is decreased and concentration of Cu atoms is increased from the second aluminum layer 13A toward the second copper layer 13B.

Figure 7:
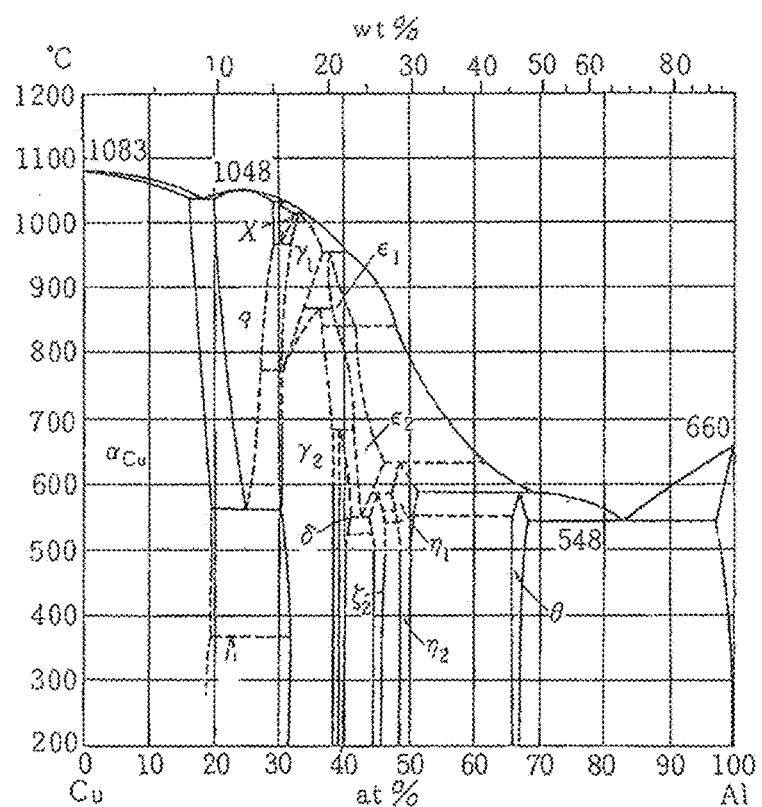
FIG. 7 is a binary phase diagram of Cu and Al.

The intermetallic compound layers 14 which are made up from the intermetallic compound of Cu and Al has a structure in which a plurality of intermetallic compounds are piled along the bonding interfaces. A thickness of the intermetallic compound layers 14 is in a range of 1 μm or larger and 80 μm or smaller; preferably, in a range of 5 μm or larger and 80 μm or smaller. The intermetallic compound layers 14 of the present embodiment have a structure in which three kinds of intermetallic compounds are piled as shown in FIG. 2. That is to say, in order from the first aluminum layer 12A (or the second aluminum layer 13A) toward the first copper layer 12B (or the second copper layer 13B), along the bonding interface between the first aluminum layer 12A (or the second aluminum layer 13A) and the first copper layer 12B (or the second copper layer 13B), θ phase 16 and $\eta_2$ phase 17 are piled, and a phase 18 including at least one of $\zeta_2$ phase 18A, a δ phase 18B and a $\gamma_2$ phase 18C are piled (FIG. 7).

Along the bonding interface between the intermetallic compound layer 14 and the first copper layer 12B (or the second copper layer 13B), oxide 19 is dispersed in a stratified state inside at least one of the θ phase 16, the $\eta_2$ phase 17, the $\zeta_2$ phase 18A, and the $\gamma_2$ phase. In the present embodiment, the oxide 19 is aluminum oxide such as alumina ($Al_2O_3$). There is a case in which the oxide 19 is dispersed in a separated state. Moreover, there is a case in which there is an area in which the intermetallic compound layer 14 and the first copper layer 12B (or the second copper layer 13B) are directly in contact to each other.

The heat sink 40 radiates the heat of the power-module substrate 10. The heat sink 40 of the present embodiment includes a heat-radiation plate 41 on which the power-module substrate 10 is bonded, and a cooling part 42 in which a flow path 42a in which coolant (e.g., cooling water) flows is formed. The heat-radiation plate 41 and the cooling part 42 are fixed by screws 43 with grease (not illustrated) therebetween. It is desirable that the heat sink 40 be made of material having excellent thermal conductivity. In this embodiment, the heat-radiation plate 41 is made of oxygen-free copper, and the cooling part 42 is made of aluminum alloy.

The heat-radiation plate 41 of the heat sink 40 and the second copper layer 13B of the metal layer 13 are bonded by a solder layer 45. The solder layer 45 is made of, for example, solder material of Sn—Sb based, Sn—Ag based, Sn—Cu based, Sn—In based, Sn—Ag—Cu based or the like, so-called lead-free solder material.

The semiconductor element 30 is an electronic component having semiconductor; a various semiconductor element is selected in accordance with a necessary function. The semiconductor element 30 is bonded to the first copper layer 12B of the circuit layer 12 with a solder layer 31 therebetween. The solder layer 31 is made of solder material of Sn—Ag based, Sn—Cu based, Sn—In based, Sn—Ag—Cu based or the like for example, so-called lead-free solder material.

Next, a producing method of the power-module substrate 10, the heat-sink-attached power-module substrate 20, and the heat-sink-attached power module 100 structured as above will be explained referring FIG. 3 to FIG. 5.

Figure 3:
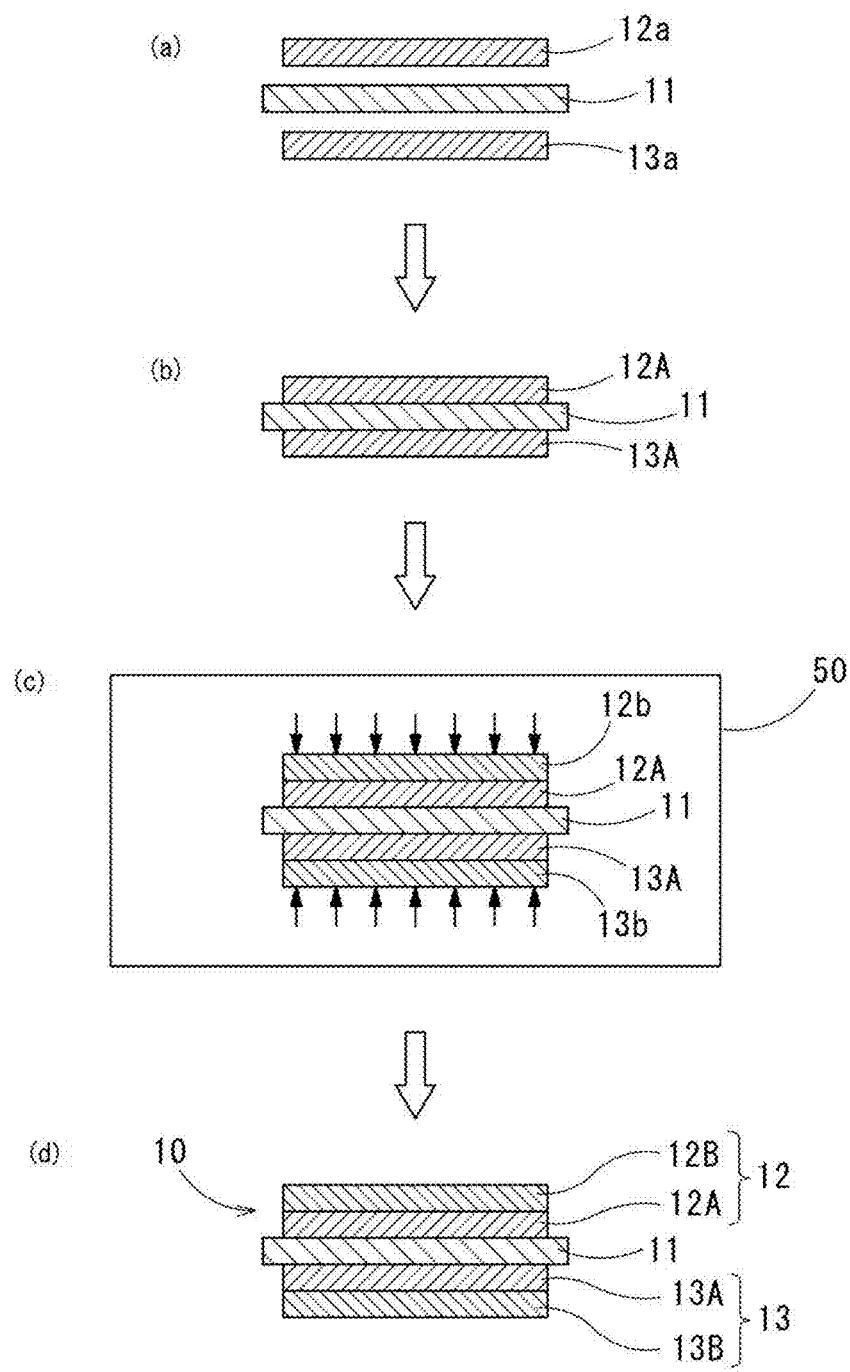
FIG. 3 is a sectional view explaining a summary of a producing method of the power-module substrate of the embodiment according to the present invention.

First, as shown in a part (a) in FIG. 3, on both the surfaces of the ceramic substrate 11 (i.e., the one surface 11f and the other surface 11b in this invention), aluminum plates 12a and 13a are respectively stacked with Al—Si based brazing material there between (not illustrated). Then, cooling them after pressurizing/heating them, the aluminum plates 12a and 13a are bonded to the ceramic substrate 11, so that the first aluminum layer 12A and the second aluminum layer 13A are formed on the ceramic substrate 11 as shown in a part (b) in FIG. 3 (aluminum layer forming step S11). Temperature for this brazing is 610° C. to 650° C.

Next, as shown in a part (c) in FIG. 3, a copper plate 12b is arranged on one side (an upper side) of the first aluminum layer 12A, and a copper plate 13b is arranged on another side (a lower side) of the second aluminum layer 13A. Then, inserting this stacked body in a vacuum heating furnace 50 in a state of being pressed in a stacking direction, and a heating process is performed. In this embodiment, solid-phase-diffusion bonding is performed with loads applied on contact surfaces of the first aluminum layer 12A and the copper plate 12b, and contact surfaces of the second aluminum layer 13A and the copper plate 13b are 0.29 MPa or higher and 3.43 MPa or lower, heating temperature is 400° C. or higher and lower than 548° C., and holding time is 5 minutes or longer and 240 minutes or shorter. Thus, as shown in a part (d) in FIG. 3, the first copper layer 12B is formed by bonding the copper plate 12b on the first aluminum layer 12A, and the second copper layer 13B is formed by bonding the copper plate 13b on the second aluminum layer 13A at the same time (copper layer forming step S12). As a result, the circuit layer 12 and the metal layer 13 are formed, the power-module substrate 10 of the present embodiment can be obtained (a part (a) in FIG. 4).

In the present embodiment, bonding surfaces between the first aluminum layer 12A and the copper plate 12b and bonding surfaces between the second aluminum layer 13A and the copper plate 13b are solid-phase-diffusion welded after smoothing by removing scratches in advance. Desirable heating temperature of vacuum heating for solid-phase-diffusion bonding is not lower than temperature which is 5° C. lower than eutectic temperature of Al and Cu and lower than the eutectic temperature.

Figure 4:
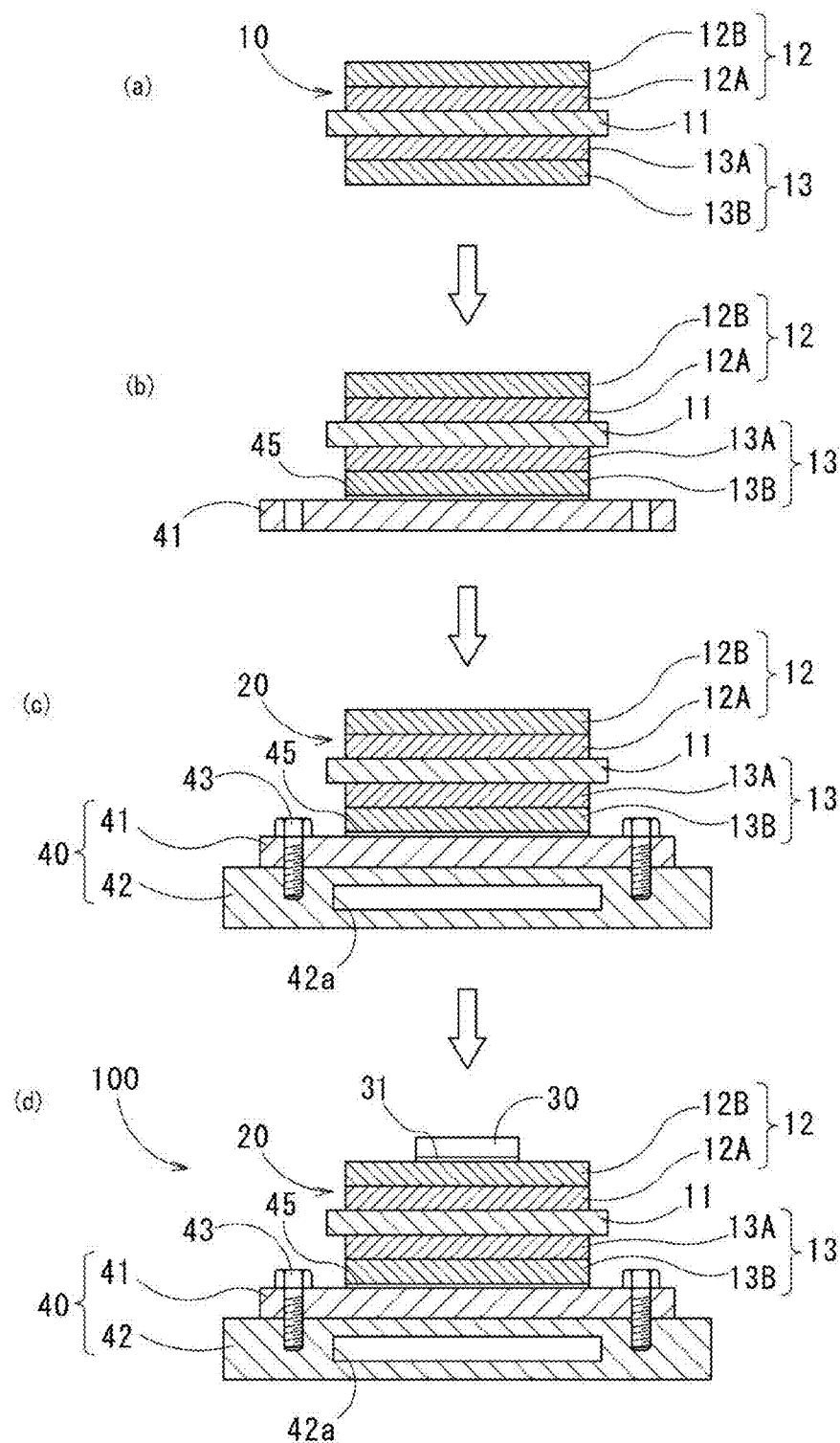
FIG. 4 is a sectional view explaining a summary of a producing method of the heat-sink-attached power module of the embodiment according to the present invention.
Figure 5:
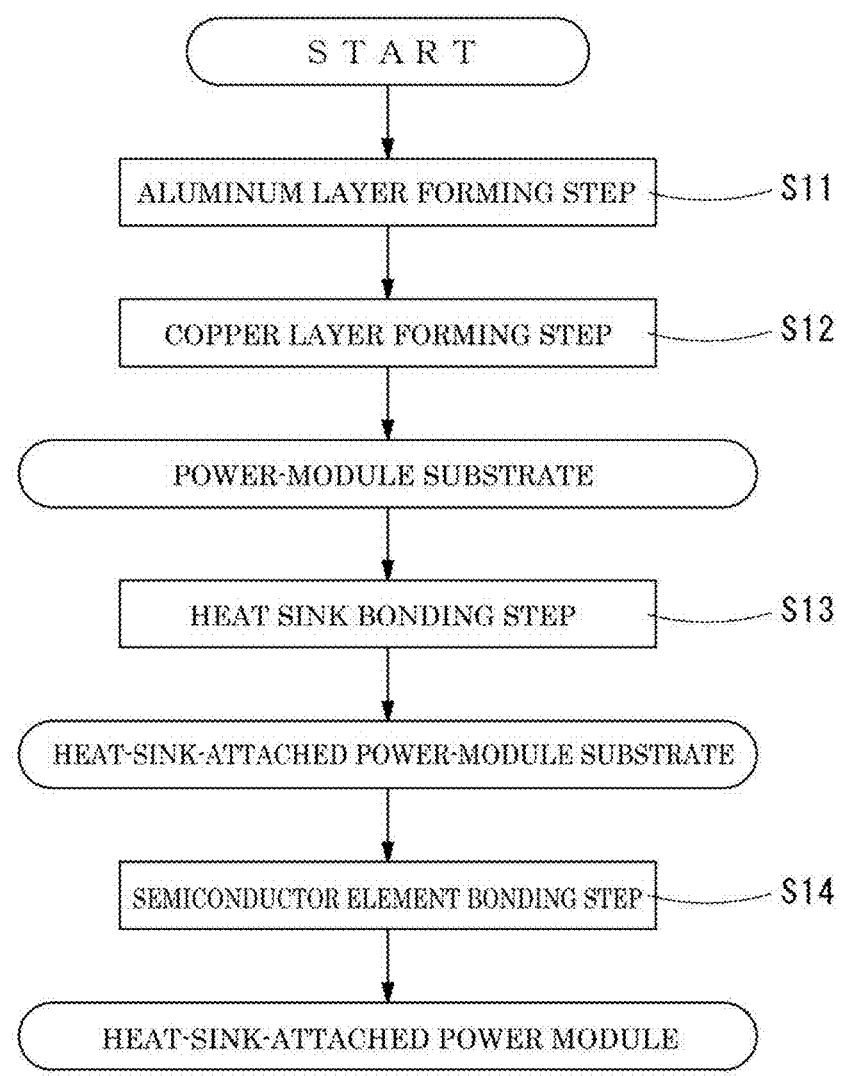
FIG. 5 is a flow chart showing a producing method of a power module of the embodiment of the present invention.

Next, as shown in parts (b) to (c) in FIG. 4, the heat sink 40 is bonded on another side (a lower side) of the power-module substrate 10 (heat sink bonding step S13). In this heat sink bonding step S13, the heat-radiation plate 41 is soldered on the other side of the power-module substrate 10 by the solder layer 45 as shown in the part (b) in FIG. 4, and then the cooling part 42 is installed to the heat-radiation plate 41 with grease therebetween, so that the heat sink 40 is bonded to the power-module substrate 10. As a result, the heat-sink-attached power-module substrate 20 can be obtained.

Finally, as shown in a part (d) in FIG. 4, by bonding the semiconductor element 30 on one surface (an upper surface in FIG. 4) of the circuit layer 12 of the heat-sink-attached power-module substrate 20 with the solder layer 31 (semiconductor element bonding step S14), the heat-sink-attached power module 100 of the present embodiment can be obtained. FIG. 5 shows a production flow of the heat-sink-attached power module 100.

According to the power-module substrate 10, the heat-sink-attached power-module substrate 20, and the heat-sink-attached power module 100 of the present embodiment having the above-mentioned structure, since the circuit layer 12 is formed from the first aluminum layer 12A which is bonded to the one surface 11f of the ceramic substrate 11 and the first copper layer 12B which is bonded to the first aluminum layer 12A and the semiconductor element 30 is mounted on the first copper layer 12B, the heat from the semiconductor element 30 can be effectively released with spreading in a surface direction at the first copper layer 12B.

Since the first aluminum layer 12A having relatively small deformation resistance is bonded between the ceramic substrate 11 and the first copper layer 12B, thermal stress owing to difference of thermal-expansion coefficients between the ceramic substrate 11 and the circuit layer 12 (the first copper layer 12B) when the thermal cycling is applied is absorbed by the first aluminum layer 12A, so that it is possible to prevent the breakage of the ceramic substrate 11. Moreover, deformation of the circuit layer 12 by a power cycle can be reduced by the first copper layer 12B having relatively large deformation resistance bonded to the first aluminum layer 12A, so that it is possible to prevent cracks of the solder layer 31 connecting the circuit layer 12 and the semiconductor element 30.

Since the first aluminum layer 12A and the first copper layer 12B are bonded to each other by solid-phase-diffusion bonding, it is possible to prevent separation between the first aluminum layer 12A and the first copper layer 12B when the thermal cycling is applied, so that thermal conductivity and electric conductivity of the circuit layer 12 can be well maintained.

Furthermore, the thickness t1 of the first copper layer 12B is 1.7 mm or larger and 5 mm or smaller. If the thickness t1 is smaller than 1.7 mm, the heat of the semiconductor element 30 is difficult to be diffused along the surface direction. Accordingly, the heat resistance by the power cycle cannot be sufficiently reduced, so that it is difficult to maintain reliability against the power cycle. Moreover, if a range of the thickness t1 is larger than 5 mm, there is no difference in heat radiation performance. Therefore, the thickness t1 is 5 mm or smaller in order to reduce size of the whole power module.

The sum of the thickness t1 of the first copper layer 12B and the thickness t2 of the second copper layer 13B is 7 mm or smaller. If the sum of them is larger than 7 mm, thermal stress is generated in the ceramic substrate excessively by the thermal cycling, the ceramic substrate may crack. No particular lowest value of the sum of the thickness t1 of the first copper layer 12B and the thickness t2 of the second copper layer 13B is limited, but it is preferable to be 3.4 mm or larger.

Since the metal layer 13 is formed from the second aluminum layer 13A which is bonded on the other surface 11b of the ceramic substrate 11 and the second copper layer 13B which is bonded on the second aluminum layer 13A, it is possible to bond favorably the metal layer 13 and the heat sink 40 without nickel plating. Since the second copper layer 13B which is bonded to the heat sink 40 with the solder layer 45 has relatively high deformation resistance, the solder layer 45 can be prevented from cracking owing to deformation of the metal layer 13 when the thermal cycling is applied, it is possible to prevent deterioration of the bonding reliability and rise in the thermal resistance. Moreover, since the second aluminum layer 13A having relatively small deformation resistance is bonded to the second copper layer 13B, even if the thermal cycling is applied, the thermal stress can be absorbed by the second aluminum layer 13A between the ceramic substrate 11 and the second copper layer 13B, and it is possible to prevent cracks of the ceramic substrate 11.

Since the second aluminum layer 13A and the second copper layer 13B are bonded to each other by solid-phase-diffusion bonding, it is possible to prevent separation the second aluminum layer 13A and the second copper layer 13B when the thermal cycling is applied, so that the thermal conductivity of the metal layer 13 can be well maintained.

The ratio t2/t1 between the thickness t1 of the first copper layer 12B and the thickness t2 of the second copper layer 13B is in the range of larger than 0 and 1.2 or smaller except for the range of 0.6 or larger and 0.8 or smaller (in other words, a range larger than 0 and smaller than 0.6 or a range larger than 0.8 and 1.2 or smaller).

In the range in which the ratio t2/t1 is 0.6 or larger and 0.8 or smaller, the thickness t1 of the first copper layer 12B and the thickness t2 of the second copper layer 13B are relatively near, so that the bend deformation of the whole power-module substrate 10 is small. However, meanwhile, the rigidity of the second copper layer 13B is high since the thickness thereof is relatively large compared with the first copper layer 12B, accordingly the bend deformations of the first copper layer 12B and the second copper layer 13B are applied on the ceramic substrate 11 with counter direction to each other when the thermal cycling is applied. As a result, even though an amount of the deformation of the whole power-module substrate 10 is small, the force applied on the ceramic substrate 11 is large, so that the ceramic substrate 11 may crack.

If the ration t2/t1 is smaller than 0.6, the thickness t2 of the second copper layer 13B is small compared with the thickness t1 of the first copper layer 12B, and rigidity of the second copper layer 13B is relatively low. Accordingly, bend deformation of the power-module substrate 10 is large owing to difference of the thermal expansions between the first copper layer 12B and the second copper layer 13B while the thermal cycling. However, the second copper layer 13B is deformed along with the first copper layer 12B, so that internal stress of the ceramic substrate 11 can be reduced and the breakage of the ceramic substrate 11 can be prevented.

In the range in which the ratio t2/t1 is larger than 0.8, since the thickness t1 of the first copper layer 12B and the thickness t2 of the second copper layer 13B are almost the same, the bend deformation of the first copper layer 12B and the bend deformation of the second copper layer 13B are balanced when the thermal cycling is applied, it is possible to reduce the bend deformation of the power-module substrate 10 so that cracks of the ceramic substrate 11 can be prevented.

The present invention is not limited to the above-described embodiment and various modifications may be made without departing from the scope of the present invention.

For example, a case in which the heat sink 40 is made of oxygen-free copper was described in the above embodiment. The heat sink 40 can be made of pure copper such as tough-pitch copper or copper alloy. The heat sink can be made of aluminum or aluminum alloy as well. In this case, by Ni plating on the heat sink, the power-module substrate and the heat sink can be favorably bonded by solder. Moreover, the connection between the heat-radiation plate 41 of the heat sink 40 and the cooling part 42 is not limited to fixing of the screws, and they can be bonded by solid-phase-diffusion bonding as well, for instance. The heat sink 40 can be formed without the heat-radiation plate 41, so that it is possible to connect the power-module substrate 10 and the cooling part 42 directly. As the heat sink, various structures for radiating heat such as a heat pipe can be used.

It was described that fixing between the first aluminum layer 12A and the first copper layer 12B and fixing between the second aluminum layer 13A and the second copper layer 13B are simultaneously performed by solid-phase-diffusion bonding, but they may be bonded separately by solid-phase-diffusion bonding.

The first aluminum layer 12A and the second aluminum layer 13A are not limited to pure aluminum of 99.99% purity and may be made of aluminum of purity 99% (so-called 2N aluminum), aluminum alloy or the like.

EXAMPLES

Next, supporting tests conducted for confirming effects of the present invention will be explained.

Invention Examples 1 to 12, Comparative Examples 1 to 4

In the producing steps of the power module, test pieces for Invention Examples 1 to 12 and for Comparative Examples 1 to 4 of the power module were made.

In the examples, power-module substrates in which the circuit layer and the metal layer were stacked on the ceramic substrate having a size of 40 mm×40 mm and a thickness of 0.635 mm and made of materials stated in Table 1 were used. The first aluminum layer of the circuit layer and the second aluminum layer of the metal layer were made by bonding aluminum plates stated in Table 1 having a size of 37 mm×37 mm and a thickness of 0.6 mm to the ceramic substrate with Al—Si based brazing material. The first copper layer of the circuit layer and the second copper layer of the metal layer were made by bonding copper plates stated in Table 1 having a size of 37 mm×37 mm respectively to the first aluminum layer and the second aluminum layer by solid-phase-diffusion bonding, so that the power-module substrates as the test pieces for the examples were produced. The solid-phase welding was conducted with pressure of $1.0 \times 10^{-6}$ Pa or higher and $1.0 \times 10^{-3}$ Pa or lower in the vacuum heating furnace.

With respect to the power-module substrates obtained as above, thermal cycling tests were conducted. Then, breakage of the ceramic substrates was evaluated with respect to the power-module substrates after the thermal cycling tests.

The thermal cycling tests were conducted on the power-module substrates using a thermal shock chamber TSB-51 produced by Espec Corp., in liquid baths (fluorine inert fluid (Fluorinert produced by 3M Company)), at −40° C.×5 minutes and 125° C.×5 minutes for 3000 cycles.

Evaluation of Breakage of Ceramic Substrate

The ceramic substrates were evaluated using an ultrasonic test device as "good" if breakage was not found or as "poor" if there was breakage. The evaluation results were shown in Table 1.

TABLE 1

| | | ALUMINUM PLATE MATERIAL | COPPER PLATE MATERIAL | CERAMIC SUBSTRATE MATERIAL | 1st COPPER LAYER THICKNESS t1 (mm) | 2nd COPPER LAYER THICKNESS t2 (mm) | RATIO t2/t1 | t1 + t2 (mm) | CERAMIC SUBSTRATE BREAKAGE |
|---|---|---|---|---|---|---|---|---|---|
| INVENTION EXAMPLE | 1 | 4N | OXYGEN-FREE COPPER | AlN | 1.7 | 2.0 | 1.18 | 3.7 | good |
| | 2 | 4N | OXYGEN-FREE COPPER | AlN | 3.0 | 0.4 | 0.13 | 3.4 | good |
| | 3 | 4N | OXYGEN-FREE COPPER | AlN | 3.0 | 1.6 | 0.53 | 4.6 | good |
| | 4 | 4N | OXYGEN-FREE COPPER | AlN | 3.0 | 2.5 | 0.83 | 5.5 | good |
| | 5 | 4N | Zr 20 ppm ADDED COPPER | AlN | 3.0 | 3.5 | 1.17 | 6.5 | good |
| | 6 | 4N | Zr 20 ppm ADDED COPPER | AlN | 5.0 | 2.0 | 0.40 | 7.0 | good |
| | 7 | 2N | OXYGEN-FREE COPPER | AlN | 2.0 | 1.8 | 0.90 | 3.8 | good |
| | 8 | 2N | OXYGEN-FREE COPPER | AlN | 4.0 | 2.0 | 0.50 | 6.0 | good |
| | 9 | 4N | TOUGH-PITCH COPPER | AlN | 2.0 | 1.8 | 0.90 | 3.8 | good |
| | 10 | 4N | TOUGH-PITCH COPPER | AlN | 4.0 | 2.0 | 0.50 | 6.0 | good |
| | 11 | 4N | OXYGEN-FREE COPPER | $Si_3N_4$ | 2.0 | 1.8 | 0.90 | 3.8 | good |
| | 12 | 4N | OXYGEN-FREE COPPER | $Si_3N_4$ | 4.0 | 2.0 | 0.50 | 6.0 | good |
| COMPARATIVE EXAMPLE | 1 | 4N | OXYGEN-FREE COPPER | AlN | 3.0 | 1.9 | 0.63 | 4.9 | poor |
| | 2 | 4N | OXYGEN-FREE COPPER | AlN | 3.0 | 2.2 | 0.73 | 5.2 | poor |
| | 3 | 4N | OXYGEN-FREE COPPER | AlN | 5.0 | 3.0 | 0.60 | 8.0 | poor |
| | 4 | 4N | OXYGEN-FREE COPPER | AlN | 2.0 | 2.7 | 1.35 | 4.7 | poor |

Invention Examples 13 to 16

Heat-sink-attached power-module substrates of Invention Examples 13 to 16 stated in Table 2 were made by bonding the power-module substrates of the above-mentioned Invention Examples 5, 7, 10 and 12 to the heat sinks stated in Table 2 using Sn—Sb solder.

In Invention Example 13, the power-module substrate of Invention Example 5 was used. In Invention Example 14, the power-module substrate of Invention Example 7 was used. In Invention Example 15, the power-module substrate of Invention Example 10 was used. In Invention Example 16, the power-module substrate of Invention Example 12 was used. In Invention Examples 13 and 16, the heat sinks made of Ni-plated Al alloy (A6063) were used. In Invention Examples 14 and 15, the heat sinks made of oxygen-free copper were used.

With respect to the heat-sink-attached power-module substrates obtained as above, bonding rates at a boundary surface between the second copper layer and the solder layer before and after the thermal cycling tests and breakage of ceramic after the thermal cycling tests were evaluated.

Primary bonding rates and after-cycle bonding rates at the boundary surface between the second copper layer and the solder layer before and after the thermal cycling tests were evaluated using the ultrasonic test device. The bonding rates were calculated by a following formula:

Bonding Rate (%)={(Primary Bonding Area)−(Separation Area)}/(Primary Bonding Area)

Here, the primary bonding area was an area to be bonded before bonding, namely, an area of the second copper layer in the present examples. A crack of the solder layer was shown by a white part in bonding part in an ultrasonic test image, so the separation area was an area of the white part.

The thermal-shock tests and evaluation of the breakage of the ceramic substrate were conducted similarly to Invention Examples 1 to 12.

TABLE 2

| | | ALUMINUM PLATE MATERIAL | COPPER PLATE MATERIAL | CERAMIC SUBSTRATE MATERIAL | HEAT SINK MATERIAL | 1st COPPER LAYER THICKNESS t1 (mm) | 2nd COPPER LAYER THICKNESS t2 (mm) |
|---|---|---|---|---|---|---|---|
| INVENTION EXAMPLE | 13 | 4N | Zr 20 ppm ADDED COPPER | AlN | Al ALLOY | 3.0 | 3.5 |
| | 14 | 2N | OXYGEN-FREE COPPER | AlN | OXYGEN-FREE COPPER | 2.0 | 1.8 |
| | 15 | 4N | TOUGH-PITCH COPPER | AlN | OXYGEN-FREE COPPER | 4.0 | 2.0 |
| | 16 | 4N | OXYGEN-FREE COPPER | $Si_3N_4$ | Al ALLOY | 4.0 | 2.0 |

| | | RATIO t2/t1 | t1 + t2 (mm) | PRIMARY BONDING RATE (%) | AFTER-CYCLE BONDING RATE (%) | CERAMIC SUBSTRATE BREAKAGE |
|---|---|---|---|---|---|---|
| INVENTION EXAMPLE | 13 | 1.17 | 6.5 | 98.6 | 93.2 | good |
| | 14 | 0.90 | 3.8 | 91.3 | 95.4 | good |
| | 15 | 0.50 | 6.0 | 98.0 | 91.8 | good |
| | 16 | 0.50 | 6.0 | 96.7 | 94.6 | good |

As known from Table 1, in Invention Examples 1 to 12 in which the thickness t1 of the first copper layer was 1.7 mm or larger and 5 mm or smaller, the ratio t2/t1 was set to the range larger than 0 and 1.2 or smaller except for the range of 0.6 or larger and 0.8 or smaller, the sum of the thickness t1 of the first copper layer and the thickness t2 of the second copper layer was 7 mm or smaller, it was possible to obtain the power-module substrate in which no breakage was generated in the ceramic substrate after the thermal cycling tests.

Moreover, as known from Table 2, in the heat-sink-attached power-module substrate of Invention Examples in which the heat sink was soldered, it was possible to obtain the heat-sink-attached power-module substrate in which no breakage was generated in the ceramic substrate after the thermal cycling tests and the bonding rate was excellent.

Figure 6:
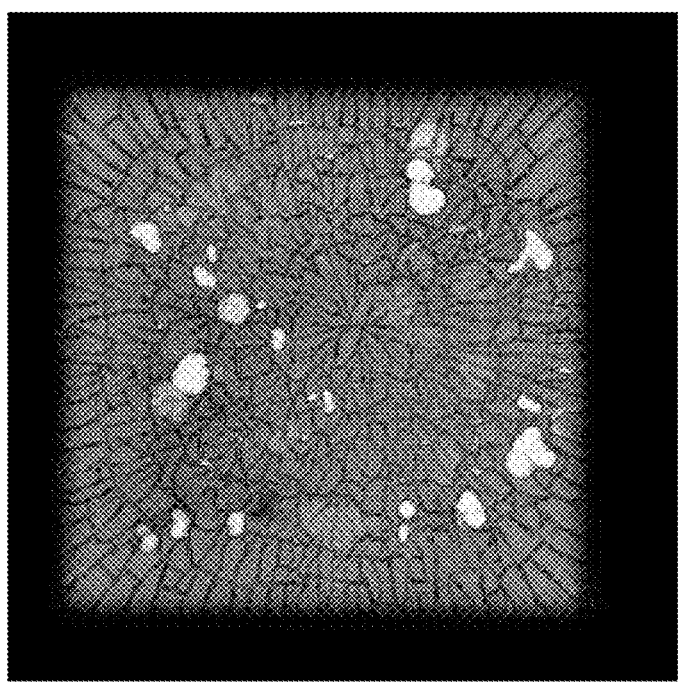
FIG. 6 is a photograph of an ultrasonic image showing a bonding interface between a circuit layer (a first aluminum layer) and a ceramic substrate after thermal cycling test.

On the other hand, in Comparative Examples 1 and 2 in which the ratio t2/t1 was 0.6 or larger and 0.8 or smaller, Comparative Example 3 in which the sum of the thickness t1 of the first copper layer and the thickness t2 of the second copper layer was larger than 7 mm, and Comparative Example 4 in which the ratio t2/t1 was larger than 1.2, as shown in the ultrasonic image of FIG. 6, breakage was generated in the ceramic substrates after the thermal cycling tests. As known from the ultrasonic image of Table 6, in Comparative Examples 1 to 4, radiate lines were confirmed and cracks were generated in the thickness direction of the ceramic substrate. White areas were dotted in addition to the radiate lines, so that it was known that cracks were generated in a horizontal direction of the ceramic substrate.

INDUSTRIAL APPLICABILITY

To prevent the reduction of the bonding reliability, the rise of the thermal resistance, and the breakage of the ceramic substrate when the thermal cycling was applied regarding the power-module substrate, the heat-sink-attached power-module substrate and the heat-sink-attached power module.

REFERENCE SIGNS LIST 10 ceramic substrate
11f one surface
11b another surface (the other surface)
12 circuit layer
12a aluminum plate
12A first aluminum layer
12b copper plate
12B first copper layer
13 metal layer
13a aluminum plate
13A second aluminum layer
13b copper plate
13B second copper layer
14 intermetallic compound layer
16 θ phase
17 $\eta_2$ phase
18A $\zeta_2$ phase
18B δ phase
18C $\gamma_2$ phase
19 oxide
20 heat-sink-attached power-module substrate
30 semiconductor element
31 solder layer
40 heat sink
41 heat-radiation plate
42 cooling part
42a flow path
43 screw
45 solder layer
50 vacuum heating furnace
100 heat-sink-attached power module

The invention claimed is:

1. A power-module substrate comprising a circuit layer which is stacked on one surface of a ceramic substrate and a metal layer which is stacked on the other surface of the ceramic substrate, wherein
   the circuit layer comprises a first aluminum layer which is bonded on the one surface of the ceramic substrate and a first copper layer which is bonded on the first aluminum layer by solid-phase-diffusion bonding,
   the metal layer comprises a second aluminum layer, which is made from a same material as that of the first aluminum layer and bonded on the other surface for the ceramic substrate, and a second copper layer, which is made from a same material as that of the first copper layer and bonded on the second aluminum layer by solid-phase-diffusion bonding,
   a thickness t1 of the first copper layer is 1.7 mm or larger and 5 mm or smaller (1.7 mm≤t1≤5 mm),
   a sum of the thickness t1 of the first copper layer and a thickness t2 of the second copper layer is 7 mm or smaller (t1+t2≤7 mm), and
   a ratio t2/t1 between the thickness t1 of the first copper layer and the thickness t2 of the second copper layer is in a range larger than 0 and 1.2 or smaller (0<t2/t1≤1.2), except for a range of 0.6 or larger and 0.8 or smaller (0.6≤t2/t1≤0.8).

2. A heat-sink-attached power-module substrate comprising the power-module substrate and a heat sink which is bonded on the second copper layer according to claim 1.

3. A heat-sink-attached power module comprising the heat-sink-attached power-module substrate and a semiconductor element which is bonded on the circuit layer according to claim 2.

* * * * *